(12) United States Patent
Markov et al.

(10) Patent No.: US 10,838,652 B2
(45) Date of Patent: Nov. 17, 2020

(54) PROGRAMMING OF MEMORY CELL HAVING GATE CAPACITIVELY COUPLED TO FLOATING GATE

(71) Applicant: Silicon Storage Technology, Inc., San Jose, CA (US)

(72) Inventors: Viktor Markov, Santa Clara, CA (US); Alexander Kotov, San Jose, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 57 days.

(21) Appl. No.: 16/217,916

(22) Filed: Dec. 12, 2018

(65) Prior Publication Data
US 2020/0065023 A1 Feb. 27, 2020

Related U.S. Application Data

(60) Provisional application No. 62/476,962, filed on Oct. 17, 2018, provisional application No. 62/722,776, filed on Aug. 24, 2018.

(51) Int. Cl.
*G11C 16/04* (2006.01)
*G11C 16/10* (2006.01)
*G06F 3/06* (2006.01)

(52) U.S. Cl.
CPC .......... *G06F 3/0652* (2013.01); *G06F 3/0604* (2013.01); *G06F 3/0679* (2013.01); *G11C 16/0425* (2013.01); *G11C 16/0433* (2013.01); *G11C 16/10* (2013.01)

(58) Field of Classification Search
CPC .. G11C 16/10; G11C 16/0425; G11C 16/0433
USPC ........................................ 365/185.14, 185.15
See application file for complete search history.

(56) References Cited

U.S. PATENT DOCUMENTS

| | | | |
|---|---|---|---|
| 5,029,130 A | 7/1991 | Yeh | |
| 6,747,310 B2 | 6/2004 | Fan et al. | |
| 6,855,980 B2 | 2/2005 | Wang et al. | |
| 6,992,929 B2 * | 1/2006 | Chen .................. | G11C 16/0483 257/314 |
| 7,315,056 B2 | 1/2008 | Klinger et al. | |
| 7,868,375 B2 | 1/2011 | Liu et al. | |
| 8,711,636 B2 | 4/2014 | Do et al. | |
| 9,245,638 B2 * | 1/2016 | Do ..................... | G11C 16/0433 |
| 2005/0083735 A1 | 4/2005 | Chen et al. | |
| 2012/0113714 A1 | 5/2012 | Choy et al. | |

* cited by examiner

*Primary Examiner* — Son L Mai
(74) *Attorney, Agent, or Firm* — DLA Piper LLP (US)

(57) ABSTRACT

A memory device with memory cells each including source and drain regions with a channel region there between, a floating gate over a first channel region portion, a select gate over a second channel region portion, a control gate over the floating gate, and an erase gate over the source region. Control circuitry is configured to, for one of the memory cells, apply a first pulse of programming voltages that includes a first voltage applied to the control gate, perform a read operation that includes detecting currents through the channel region for different control gate voltages to determine a target control gate voltage using the detected currents that corresponds to a target current through the channel region, and apply a second pulse of programming voltages that includes a second voltage applied to the control gate that is determined from the first voltage, a nominal read voltage and the target voltage.

32 Claims, 3 Drawing Sheets

PROGRAMMING OF MEMORY CELL HAVING GATE CAPACITIVELY COUPLED TO FLOATING GATE

RELATED APPLICATIONS

This application claims the benefit of U.S. Provisional Application No. 62/722,776 filed on Aug. 24, 2018, and of U.S. Provisional Application No. 62/746,962 filed on Oct. 17, 2018, which are incorporated herein by reference.

FIELD OF THE INVENTION

The present invention relates to non-volatile memory arrays.

BACKGROUND OF THE INVENTION

Split gate non-volatile memory cells, and arrays of such cells, are well known. For example, a conventional split gate memory cell 10 having four gates is shown in FIG. 1. Each memory cell 10 includes source region 14 and a drain region 16 formed in a semiconductor substrate 12, with a channel region 18 extending there between. A floating gate 20 is formed over and insulated from (and controls the conductivity of) a first portion of the channel region 18, and preferably over a portion of the source region 14. A select gate 22 (also referred to a word line gate) is disposed over and insulated from (and controls the conductivity of) a second portion of the channel region 18, and is also laterally adjacent to the floating gate 20. A control gate 28 is disposed over and insulated from the floating gate 20. An erase gate 30 is disposed over and insulated from the source region 14. Preferably, the memory cells 10 are formed in pairs, where each pair shares a common erase gate 30 and a common source region 14, and the pairs are arranged end to end so that each drain region 16 is shared by two adjacent memory cell pairs.

The memory cell 10 is erased (where electrons are removed from the floating gate 20) by placing a high positive voltage on the erase gate 30, which causes electrons on the floating gate 20 to tunnel through the intermediate insulation from the floating gate 20 to the erase gate 30 via Fowler-Nordheim tunneling (graphically shown in FIG. 1 by the arrow extending from the floating gate 20 to the erase gate 30). Erase efficiency is enhanced by having a notch in the erase gate 30 wrap around an upper edge of the floating gate 20.

The memory cell 10 is programmed (where electrons are placed on the floating gate 20) by placing appropriate positive voltages on the select gate 22, the control gate 28, the erase gate 30 and the source region 14, and a current source on the drain 16. Electrons will flow from the drain 16 to the source 14 along the channel region 18. The electrons will accelerate and become heated when they reach the gap between the select gate 22 and the floating gate 20. Some of the heated electrons will be injected through the gate oxide insulation under the floating gate and onto the floating gate 20 due to the attractive electrostatic force from the floating gate 20 (which results from capacitive coupling of the positive voltage on the control gate 28 to the floating gate 20), as shown in FIG. 1. This programming technique is known as hot-electron injection, and is graphically illustrated in FIG. 1 by the arrow extending along the channel region 18 and into the floating gate 20.

The memory cell 10 is read by placing positive read voltages on the drain region 16, the select gate 22 (which turns on the channel region portion under the select gate 22) and the control gate 28 (which is capacitively coupled to the floating gate 20). If the floating gate 20 is positively charged (i.e. erased of electrons and capacitively coupled to the positive voltage on the control gate 28), then the portion of the channel region under the floating gate 20 is turned on as well by the capacitively coupled voltage, and current will flow across the channel region 18, which is sensed as the erased or "1" state. If the floating gate 20 is negatively charged (i.e. programmed with electrons), then the portion of the channel region under the floating gate 20 is mostly or entirely turned off (i.e., the capacitively coupled voltage from the control gate 28 is not enough to overcome the negative charge stored on the floating gate 20), and current will not flow (or there will be little flow) across the channel region 18, which is sensed as the programmed or "0" state.

It is also possible to operate memory cell 10 so it has multiple program states (referred to as multi-level cells (MLC), where memory cell 10 has more than two distinct program states, such as four states 11, 10, 01 and 00 to store two bits of information). It also is possible to operate memory cell 10 in an analog manner (i.e., no discrete programming states to produce a range of analog read signal values). In both cases, it is important not to over-program the memory cell (i.e., place to many electrons on the floating gate) because the memory cell would not later produce read operation results that properly reflect the intended program state. But, it is also important to ensure the memory cell 10 is sufficiently programmed so that its program state can be reliably detected later during a read operation. Again, for multi-level cell or analog cell applications, under-programming the memory cell would also not produce the desired read operation results. Therefore, conventionally, it is known to apply the programming voltages in discrete pulses, with an intervening read operation in-between the programming pulses. Specifically, a program pulse of voltages is applied to the memory cell, and then a read operation is performed to determine if the read current across the channel is below a desired threshold value. If not, then another pulse of program voltages is applied, and another read operation is performed to see if the read current across the channel is below the threshold value. The process continues until the read current across the channel is below the threshold value. In order to prevent over-programming, the pulses are relatively short, and many pulses are required to sufficiently program a memory cell without over-programming. In fact, a typical memory cell can require between 10 and 30, or even more, pulses of program voltages to properly program the memory cell to its desired "0" state. This is the case because each programming pulse cannot incrementally change the programming state of the memory cell by more than a target window (i.e., a target range) for the desired programming state (otherwise an undesired level of over-programming is likely). The advantage of this technique is that the memory cell is incrementally programmed until it quite precisely achieves the desired program state (which will provide the desired read current during a read operation so that the program state can be reliably detected). The drawback to this technique is that it takes a relatively long time to perform so many programming voltage pulses separated by multiple read operations (e.g., tens of microseconds).

There is a need for a memory cell programming technique that accurately and reliably programs the memory cells, without over-programming the memory cells, in a reduced amount of time.

BRIEF SUMMARY OF THE INVENTION

The aforementioned problems and needs are addressed by a memory device that includes memory cells arranged in rows and columns and control circuitry. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry configured to, for one of the memory cells, apply a first pulse of programming voltages to the source region, the select gate, the erase gate and the control gate, wherein the first pulse of programming voltages includes a first voltage applied to the control gate, perform a read operation, after the applying of the first pulse of programming voltages, that includes detecting currents through the channel region for different voltages applied to the control gate, and determining a target voltage for the control gate using the detected currents that corresponds to a target current through the channel region, apply a second pulse of programming voltages to the source region, the select gate, the erase gate and the control gate, wherein the second pulse of programming voltages includes a second voltage applied to the control gate that is determined from the first voltage, a nominal voltage and the target voltage, and determine, after the applying of the first and second pulses of programming voltages, a program state of the one memory cell by applying respective read voltages to the drain region, the select gate and the control gate, while detecting any current in the channel region, wherein the read voltages include the nominal voltage applied to the control gate.

A memory device can include memory cells arranged in rows and columns and control circuitry. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry configured to, for one of the memory cells, apply a first pulse of programming voltages to the source region, the select gate, the erase gate and the control gate, wherein the first pulse of programming voltages includes a first voltage applied to the erase gate, perform a read operation, after the applying of the first pulse of programming voltages, that includes detecting currents through the channel region for different voltages applied to the erase gate, and determining a target voltage for the erase gate using the detected currents that corresponds to a target current through the channel region, apply a second pulse of programming voltages to the source region, the select gate, the erase gate and the control gate, wherein the second pulse of programming voltages includes a second voltage applied to the erase gate that is determined from the first voltage, a nominal voltage and the target voltage, and determine, after the applying of the first and second pulses of programming voltages, a program state of the one memory cell by applying respective read voltages to the drain region, the select gate, the erase gate and the control gate, while detecting any current in the channel region, wherein the read voltages include the nominal voltage applied to the erase gate.

A memory device can include memory cells arranged in rows and columns and control circuitry. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The control circuitry configured to, for one of the memory cells, apply a first pulse of programming voltages to the source region, the select gate, the erase gate and the control gate, wherein the first pulse of programming voltages includes a first voltage applied to the control gate and a second voltage applied to the erase gate, perform a read operation, after the applying of the first pulse of programming voltages, that includes detecting currents through the channel region for different voltages applied to the control gate and the erase gate, and determining a first target voltage for the control gate and a second target voltage for the erase gate using the detected currents that correspond to a target current through the channel region, apply a second pulse of programming voltages to the source region, the select gate, the erase gate and the control gate (wherein the second pulse of programming voltages includes a third voltage applied to the control gate that is determined from the first voltage, a first nominal voltage and the first target voltage, and a fourth voltage applied to the erase gate that is determined from the second voltage, a second nominal voltage and the second target voltage), and determine, after the applying of the first and second pulses of programming voltages, a program state of the one memory cell by applying respective read voltages to the drain region, the select gate, the erase gate and the control gate, while detecting any current in the channel region, wherein the read voltages include the first nominal voltage applied to the control gate and the second nominal voltage applied to the erase gate.

A method of operating a memory device that includes memory cells arranged in rows and columns. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method includes, for one of the memory cells, applying a first pulse of programming voltages to the source region, the select gate, the erase gate and the control gate, wherein the first pulse of programming voltages includes a first voltage applied to the control gate, performing a read operation, after the applying of the first pulse of programming voltages, that includes detecting currents through the channel region for different voltages applied to the control gate, and determining a target voltage for the control gate using the detected currents that corresponds to a target current through the channel region, applying a second pulse of programming voltages to the source region, the select gate, the erase gate and the control gate, wherein the second pulse of programming voltages includes a second voltage applied to the control gate that is determined from the first voltage, a nominal voltage and the target voltage, and determining, after the applying of the first and second pulses of programming voltages, a program state of the one memory cell by applying respective read voltages to the drain region, the select gate and the control gate, while detecting any current in the channel region, wherein the read voltages include the nominal voltage applied to the control gate.

A method of operating a memory device that includes memory cells arranged in rows and columns. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method includes, for one of the memory cells, applying a first pulse of programming voltages to the source region, the select gate, the erase gate and the control gate, wherein the first pulse of programming voltages includes a first voltage applied to the erase gate, performing a read operation, after the applying of the first pulse of programming voltages, that includes detecting currents through the channel region for different voltages applied to the erase gate, and determining a target voltage for the erase gate using the detected currents that corresponds to a target current through the channel region, applying a second pulse of programming voltages to the source region, the select gate, the erase gate and the control gate, wherein the second pulse of programming voltages includes a second voltage applied to the erase gate that is determined from the first voltage, a nominal voltage and the target voltage, and determining, after the applying of the first and second pulses of programming voltages, a program state of the one memory cell by applying respective read voltages to the drain region, the select gate, the erase gate and the control gate, while detecting any current in the channel region, wherein the read voltages include the nominal voltage applied to the erase gate.

A method of operating a memory device that includes memory cells arranged in rows and columns. Each of the memory cells includes a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate. The method includes, for one of the memory cells, applying a first pulse of programming voltages to the source region, the select gate, the erase gate and the control gate, wherein the first pulse of programming voltages includes a first voltage applied to the control gate and a second voltage applied to the erase gate, performing a read operation, after the applying of the first pulse of programming voltages, that includes detecting currents through the channel region for different voltages applied to the control gate and the erase gate, and determining a first target voltage for the control gate and a second target voltage for the erase gate using the detected currents that correspond to a target current through the channel region, applying a second pulse of programming voltages to the source region, the select gate, the erase gate and the control gate (wherein the second pulse of programming voltages includes a third voltage applied to the control gate that is determined from the first voltage, a first nominal voltage and the first target voltage, and a fourth voltage applied to the erase gate that is determined from the second voltage, a second nominal voltage and the second target voltage), and determining, after the applying of the first and second pulses of programming voltages, a program state of the one memory cell by applying respective read voltages to the drain region, the select gate, the erase gate and the control gate, while detecting any current in the channel region, wherein the read voltages include the first nominal voltage applied to the control gate and the second nominal voltage applied to the erase gate.

Other objects and features of the present invention will become apparent by a review of the specification, claims and appended figures.

DETAILED DESCRIPTION OF THE INVENTION

Figure 1:
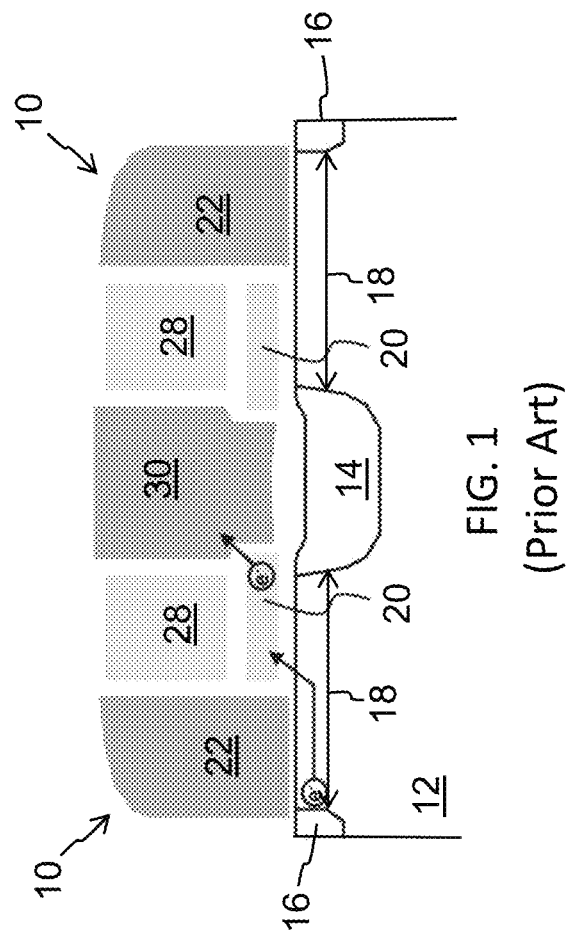
FIG. 1 is a side cross sectional view of a 4-gate non-volatile memory cell.

The present invention involves a new programming technique, which involves as few as two pulses of programming voltages to accurately program the memory cell without undue risk of over-programming. The programming technique exploits the fact that the magnitude of the voltage applied to control gate 28 during programming strongly dictates how much the programming pulse ends up programming the memory cell.

The programming technique begins by applying a first pulse of programming voltages to the memory cell being programmed, where the voltage applied to the control gate 28 during this first pulse is an initial value $V_{cg1}$. This first pulse of programming voltages programs the memory cell to a first program state. Then, a first sweeping read operation is performed in which the read voltage on the control gate 28 is swept over a range of values as the read current through the channel region 18 is measured or detected. The purpose of this read operation is to determine a target voltage $V_{tcg}$ on the control gate 28 that produces a target read current $I_t$ through the channel region 18. Once $V_{tcg}$ is determined from the read operation, the memory cell is erased by an erase operation. Then, a second pulse of programming voltages is applied to the memory cell, where the voltage $V_{cg2}$ applied to the control gate 28 during this second pulse of programming voltages is determined by:

$$V_{cg2}=V_{cg1}+V_{cgn}-V_{tcg} \quad \text{Equation 1}$$

where $V_{cgn}$ is the nominal read bias for the control gate 28 that will be used to read the programming state of the memory cell during normal read operations. A non-limiting example of $V_{cgn}$ is 2.5 V. It has been discovered by the present inventors that there is a high likelihood that this second pulse of programming voltages places the memory cell in the desired programming state. A second read operation can be performed to confirm this. If the desired programming state is confirmed, it will have been achieved by only two programming pulses.

It has further been discovered that under certain circumstances, the erase operation can be omitted between the first and second programming pulses. Specifically, if it is determined that $V_{cg2}$ as determined by Equation 1 is greater than $V_{cg1}+V_d$, where $V_d$ is a delta voltage value that varies based upon memory cell characteristic and process technology (e.g., is approximately 0.8V to 1.0V for typical memory cells), then the intervening erase operation between the first and second program pulses can be omitted. $V_d$ is the minimum difference between $V_{cg2}$ and $V_{cg1}$ that results in essentially the same change to the programming state of the memory cell 10 as a result of both programming pulses (one using $V_{cg1}$ and one using $V_{cg2}$) and as a result of just one programming pulse (using just $V_{cg2}$). Programming state refers to the number of electrons on the floating gate.

Non-limiting exemplary voltages and currents for the first and second programming pulses are provided in the table below:

TABLE 1

|  | Source 14 | Drain 16 | Select gate 22 | Erase gate 30 | Control gate 28 |
|---|---|---|---|---|---|
| First program pulse | 4.5 V | 1 µA | 1 V | 4.5 V | $V_{cg1}$ = 8 V |
| Second program pulse | 4.5 V | 1 µA | 1 V | 4.5 V | $V_{cg2}$ |

Non-limiting exemplary voltages for reading and erasing the memory cells are provided in the table below:

TABLE 2

|  | Source 14 | Drain 16 | Select gate 22 | Erase gate 30 | Control gate 28 |
|---|---|---|---|---|---|
| Read | 0 V | 0.8 V | 2.5 V | 0 V | $V_{cgn}$ = 2.5 V |
| Erase | 0 V | 0 V | 0 V | 11.5 V | 0 V |

In the above described two pulse programming technique, if it is determined from the second read operation that the desired programming state was not achieved, there are several options. First, if it is determined from the second read operation that the memory cell was under-programmed by the second pulse of programming voltages, then the prior art technique of small incremental programming pulses separated by confirming read operations can be used to incrementally continue programming the memory cell until the desired programming state is achieved. However, even in this case, the overall number of programming pulses is drastically reduced compared to using only the prior art incremental programming technique. Second, if it is determined from the second read operation that the desired programming state was not achieved, the erase operation can be repeated and a third programming pulse can be applied according to the following formula:

$$V_{cg3}=V_{cg2}+V_{cgn}-V_{tcg2} \quad \text{Equation 2}$$

Specifically, after the second programming pulse is applied and it is determined that the memory cell is over or under programmed, a second sweeping read operation is performed in which the read voltage on the control gate 28 is swept over a range of values as the read current through the channel region 18 is measured or detected. The purpose of this second sweeping read operation is to determine a second target voltage $V_{tcg2}$ on the control gate that produces the target read current $I_t$ through the channel region 18. Then, the memory cell is erased, and a third pulse of programming voltages is applied to the memory cell, where the voltage $V_{cg3}$ is applied to the control gate during this third pulse of programming voltages in accordance with Equation 2. It has been discovered that this second program iteration (sweep read, erase, third programming pulse) can compensate for secondary effects in the memory cells. The initial read operation after the second programming pulse can be performed using $V_{cgn}$ to determine if the cell is properly programmed, and if not, then the sweeping read operation is performed to determine $V_{tcg2}$. Alternately, the initial read operation after the second programming pulse can be a sweeping read operation, whereby the second program iteration is triggered only if the voltage on the control gate needed to reach $I_t$ is different (exactly or within a predetermined range) from $V_{cgn}$. If after the third programming pulse, a read operation is performed and it is determined the desired programming state is not achieved, the process described above with respect to equation 2 can be repeated iteratively until the desired programming state is achieved (i.e., using the equation $V_{cg(k)}=V_{cg(k-1)}+V_{cgn}-V_{tcg(k-1)}$, where k is 4 for the first iterative repeat, k is 5 for the second iterative repeat, etc.).

Voltage coupling to the floating gate during programming not only occurs between the control gate and the floating gate, but also between the erase gate and the floating gate. Therefore, in a first alternate embodiment, it is possible to vary the voltage on the erase gate instead of the control gate in the two pulse programming technique. Specifically, the first pulse of programming voltages to the memory cell being programmed would include an initial voltage $V_{e1}$ applied to the erase gate 30. Then, a first sweep read operation is performed in which the read voltage on the erase gate 30 is swept over a range of values as the read current through the channel region 18 is measured or detected. The purpose of this read operation is to determine a target voltage $V_{te}$ on the erase gate that produces a target read current $I_t$ through the channel region 18. Once target voltage $V_{te}$ is determined from the read operation, the memory cell is erased by an erase operation. Then, a second pulse of programming voltages is applied to the memory cell, where the voltage $V_{e2}$ applied to the erase gate during this second pulse of programming voltages is determined by:

$$V_{e2}=V_{e1}+V_{en}-V_{te} \quad \text{Equation 3}$$

where $V_{en}$ is the nominal read bias for the erase gate that will be used to read the programming state of the memory cell during normal read operations. A non-limiting example of $V_{en}$ is 2.5 V. Non-limiting exemplary voltages and currents for the first and second programming pulses for this first alternate embodiment are provided in the table below:

TABLE 3

|  | Source 14 | Drain 16 | Select gate 22 | Erase gate 30 | Control gate 28 |
|---|---|---|---|---|---|
| First program pulse | 4.5 V | 1 μA | 1 V | $V_{e1}$ = 4.5 V | 8 V |
| Second program pulse | 4.5 V | 1 μA | 1 V | $V_{e2}$ | 8 V |

Non-limiting exemplary voltages for reading and erasing the memory cells for this first alternate embodiment are provided in the table below:

TABLE 4

|  | Source 14 | Drain 16 | Select gate 22 | Erase gate 30 | Control gate 28 |
|---|---|---|---|---|---|
| Read | 0 V | 0.8 V | 2.5 V | $V_{en}$ = 2.5 V | 2.5 V |
| Erase | 0 V | 0 V | 0 V | 11.5 V | 0 V |

It has further been discovered that under certain circumstances, the erase operation can be omitted between the first and second programming pulses for this first alternate embodiment. Specifically, if it is determined that $V_{e2}$ is greater than $V_{e1}+V_{ed}$, where $V_{ed}$ is a delta voltage value that varies based upon memory cell characteristic and process technology (e.g., is approximately 1 V to 2 V for typical memory cells), then the intervening erase operation between the first and second program pulses can be omitted. $V_{ed}$ is the minimum difference between $V_{e2}$ and $V_{e1}$ that results in essentially the same change to the programming state to the memory cell as a result of both programming pulses (one using $V_{e1}$ and one using $V_{e2}$) and as a result of just one programming pulse (using just $V_{e2}$).

In a second alternate embodiment, both the control gate voltage and the erase gate voltage are changed in the two pulse programming technique. Specifically, the first pulse of programming voltages to the memory cell being programmed would include an initial voltage $V_{e1}$ applied to the erase gate 30 and an initial voltage $V_{cg1}$ applied to the control gate 28. Then, a read operation is performed in which the read voltages on the control gate 28 and erase gate 30 are swept over ranges of values as the read current through the channel region 18 is measured or detected. The purpose of this read operation is to determine target voltages $V_{te}$ and $V_{tcg}$ on the erase gate 30 and control gate 28 respectively that produce a target read current $I_t$ through the channel region 18. Once $V_{te}$ and $V_{tcg}$ are determined from the read operation, the memory cell 10 is erased by an erase operation. Then, a second pulse of programming voltages is applied to the memory cell, where the voltage $V_{e2}$ applied to the erase gate and the voltage $V_{cg2}$ applied to the control gate during this second pulse of programming voltages are determined by:

$$V_{e2}=V_{e1}+V_{en}-V_{te} \quad \text{Equation 4}$$

$$V_{cg2}=V_{cg1}+V_{cgn}-V_{tcg} \quad \text{Equation 5}$$

Non-limiting exemplary voltages and currents for the first and second programming pulses for this second alternate embodiment are provided in the table below:

TABLE 5

|  | Source 14 | Drain 16 | Select gate 22 | Erase gate 30 | Control gate 28 |
|---|---|---|---|---|---|
| First program pulse | 4.5 V | 1 μA | 1 V | $V_{e1}$ = 4.5 V | $V_{cg1}$ = 8 V |
| Second program pulse | 4.5 V | 1 μA | 1 V | $V_{e2}$ | $V_{cg2}$ |

Non-limiting exemplary voltages for reading and erasing the memory cells for this second alternate embodiment are provided in the table below:

TABLE 6

|  | Source 14 | Drain 16 | Select gate 22 | Erase gate 30 | Control gate 28 |
|---|---|---|---|---|---|
| Read | 0 V | 0.8 V | 2.5 V | $V_{en}$ = 2.5 V | $V_{cgn}$ = 2.5 V |
| Erase | 0 V | 0 V | 0 V | 11.5 V | 0 V |

It has further been discovered that under certain circumstances, the erase operation can be omitted between the first and second programming pulses for this second alternate embodiment. Specifically, if it is determined that $V_{e2}$ is greater than $V_{e1}+V_{ed}$, and $V_{cg2}$ is greater than $V_{cg1}+V_d$, then the intervening erase operation between the first and second program pulses can be omitted.

Figure 2:
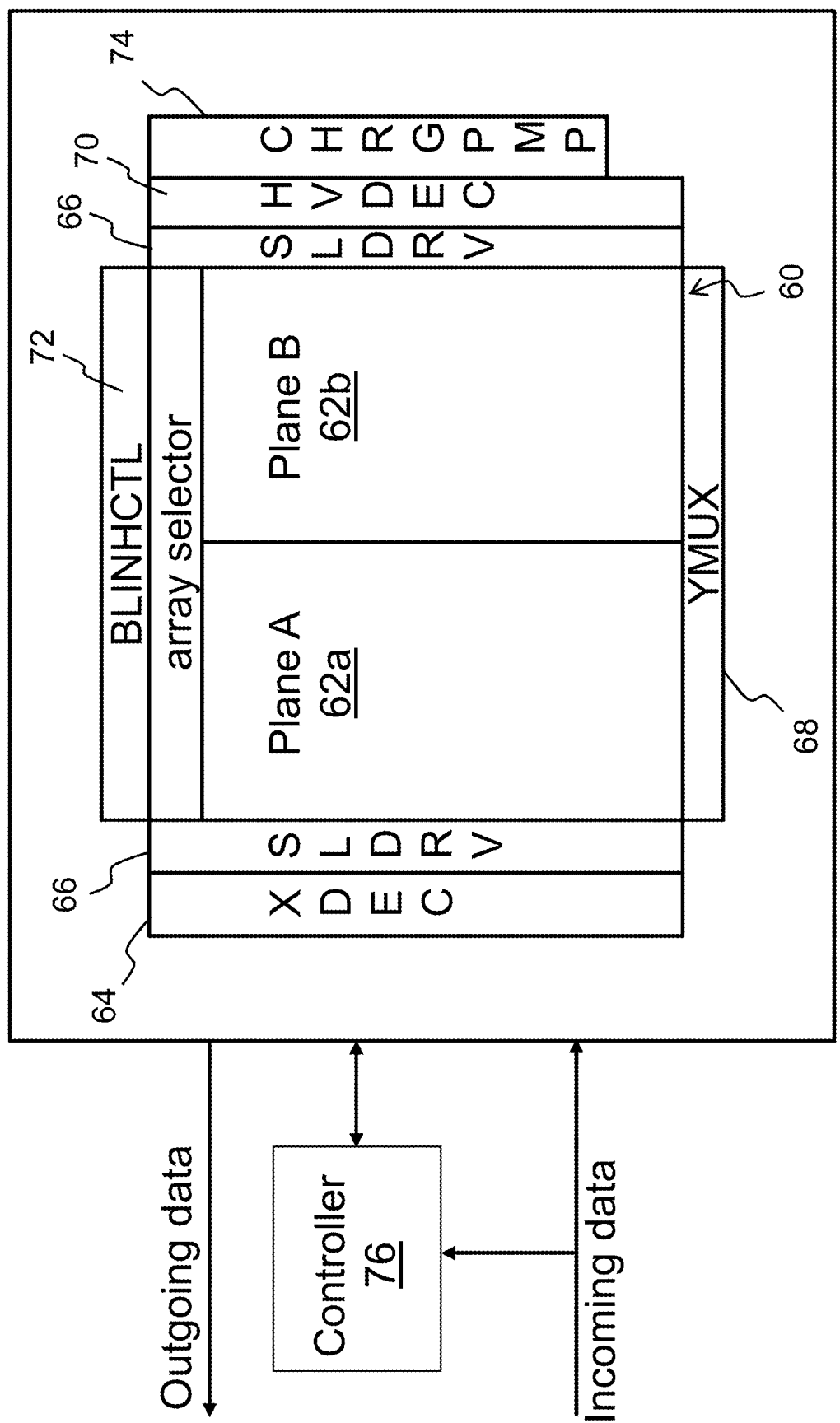
FIG. 2 is a plan view of a memory device architecture.

The architecture of an exemplary memory device is illustrated in FIG. 2. The memory device includes an array 60 of non-volatile memory cells, which can be segregated into two separate planes (Plane A 62a and Plane B 62b). The memory cells can be of the type (i.e. memory cells 10) shown in FIG. 1, formed on a single chip, arranged in a plurality of rows and columns in the semiconductor substrate 12. Adjacent to the array 60 of non-volatile memory cells are address decoders (e.g. XDEC 64 (a row decoder that drives the word lines), SLDRV 66 (a source line driver for driving the source lines), YMUX 68 (a column decoder that drives the bit lines), HVDEC 70 (a high voltage decoder) and a bit line controller (BLINHCTL 72), which are used to decode addresses and supply the various voltages to the various memory cell gates and regions during read, program, and erase operations for selected memory cells. Controller 76 (containing control circuitry) controls the various device elements to implement each operation (program, erase, read) on target memory cells (i.e., to directly or indirectly provide the voltages and currents to operate the memory cells as discussed herein). A charge pump CHRGPMP 74 provides the various voltages used to read, program and erase the memory cells under the control of the controller 76.

Figure 3:
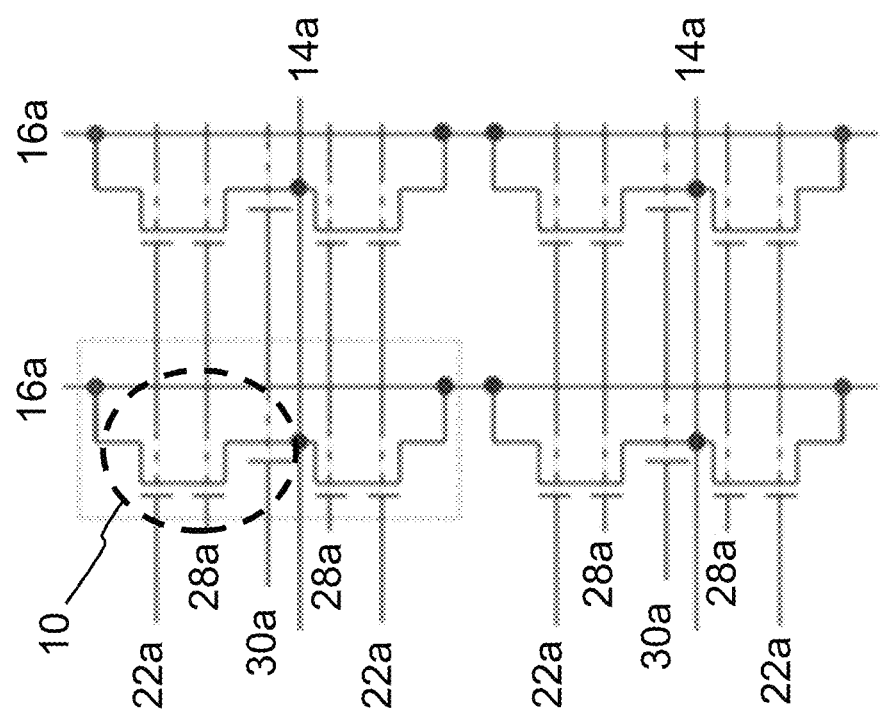
FIG. 3 is a schematic/layout view of the array of memory cells (with the floating gates not indicated for simplicity).

A significant advantage of the present invention is that programming of multiple cells can occur simultaneously, and at different granularities (i.e., different numbers of memory cells are involved) with respect to the first and second programming pulses. This is explained with respect to FIG. 3, which shows the architecture of the memory array (with the floating gates not indicated for simplicity). Specifically, each horizontal select gate line 22a electrically connects together all the select gates 22 for that row of memory cells 10. Each horizontal control gate line 28a electrically connects together all the control gates 28 for that row of memory cells 10. Each horizontal source line 14a electrically connects together all the source regions 14 for two rows of memory cells 10 that share the source regions 14. Each bit line 16a electrically connects together all the drain regions 16 for that column of memory cells 10. Each erase gate line 30a electrically connects together all the erase gates 30 for two rows of memory cells 10 that share the erase gate 30. Therefore, all the gate lines and the source line run in the horizontal (row) direction, and the bit lines run in the vertical (column) direction.

With the above described memory array architecture, the programming of multiple cells can be performed concurrently. Specifically, both the first programming pulse and the second programming pulse can be applied to multiple memory cells simultaneously as follows. To begin with, because every memory cell being programmed is preferably initially programmed using the same values for the first programming pulse, memory cells in different rows and different columns can be programmed with the first programming pulse at the same time. For example, the first program pulse can be applied to multiple memory cells 10 on the same bit line 16a, including the application of $V_{cg1}$ to the control gates 28 via control gate lines 28a. Programming of non-target cells on the same bit line can be prevented by removing one or more of the programming voltages for those rows of memory cells, and programming of non-target cells on other bit lines can be prevented by placing a program inhibit voltage on those bit lines. Depending on which cells are to be programmed, it is possible to program multiple cells in multiple rows and in multiple columns with the first program pulse at the same time. However, it should be noted that there may be a practical limit to the number of cells that can be programmed at once, because the peripheral circuitry likely cannot supply enough voltage and/or current to program all or even most of the memory cells at once (i.e., in most cases, it would be too costly and use too much space to include peripheral circuitry that can supply enough voltage/current to program all the memory cells at once). But, for most array designs, the peripheral circuitry can program two or more memory cells with the first program pulse at the same time.

The second program pulse can also be applied to multiple memory cells 10 at the same time. Specifically, after $V_{cg2}$ has been determined for multiple memory cells 10, the second program pulse can be applied to multiple memory cells 10 in the same row so long as their respective $V_{cg2}$ values are the same (because they share the same control gate line 28a). Additionally, the second program pulse can be applied to multiple memory cells 10 in different rows on the same bit line 16a at the same time, because the different $V_{cg2}$ values can be applied to the separate control gate lines 28a for the different rows. As is evident from the above, multiple pairs of rows of memory cells can be erased simultaneously by supplying the erase voltage to multiple erase gate lines 30a at the same time.

The simultaneous programming of multiple memory cells using the first programming pulse and/or the second programming pulse is described with respect to the first embodiment, where reading is performed by sweeping the control gate voltage, and the second program pulse is customized for each cell based on determining the appropriate control gate voltage $V_{cg2}$. However, simultaneous programming can equally be performed for the first alternate embodiment described above where reading is performed by sweeping the erase gate voltage, and the second program pulse is customized for each cell based on determining the appropriate erase gate voltage $V_{e2}$.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Single layers of material could be formed as multiple layers of such or similar materials, and vice versa. Finally, this invention is ideal for different memory cell applications, namely multi-level cell (where the memory cell has two or more different program states in addition to the unprogrammed state), and analog (where the program states are not limited to discrete steps).

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device, comprising:
   memory cells arranged in rows and columns, wherein each of the memory cells includes:
   a source region and a drain region formed in a semiconductor substrate, with a channel region of the substrate extending between the source and drain regions,
   a floating gate disposed over and insulated from a first portion of the channel region, for controlling a conductivity of the first portion of the channel region,
   a select gate disposed over and insulated from a second portion of the channel region, for controlling a conductivity of a second portion of the channel region,
   a control gate disposed over and insulated from the floating gate, and
   an erase gate disposed over and insulated from the source region, and disposed adjacent to and insulated from the floating gate; and
   control circuitry configured to, for one of the memory cells:
   apply a first pulse of programming voltages to the source region, the select gate, the erase gate and the control gate, wherein the first pulse of programming voltages includes a first voltage applied to the control gate,
   perform a read operation, after the applying of the first pulse of programming voltages, that includes detecting currents through the channel region for different voltages applied to the control gate, and determining a target voltage for the control gate using the detected currents that corresponds to a target current through the channel region, apply a second pulse of programming voltages to the source region, the select gate, the erase gate and the control gate, wherein the second pulse of programming voltages includes a second voltage applied to the control gate that is determined from the first voltage, a nominal voltage and the target voltage, and determine, after the applying of the first and second pulses of programming voltages, a program state of the one memory cell by applying respective read voltages to the drain region, the select gate and the control gate, while detecting any current in the channel region, wherein the read voltages include the nominal voltage applied to the control gate.

2. The memory device of claim 1, wherein, for the one memory cell, the second voltage applied to the control gate is determined from the first voltage plus the nominal voltage minus the target voltage.

3. The memory device of claim 1, wherein the control circuitry is further configured to, for the one memory cell, perform an erase operation, after the read operation and before the applying of the second pulse of programming voltages, that includes applying a positive voltage to the erase gate.

4. The memory device of claim 1, wherein the control circuitry is further configured to, for the one memory cell:

perform a second read operation, after the applying of the first and second pulses of programming voltages, that includes detecting second currents through the channel region for different voltages applied to the control gate, and determining a second target voltage for the control gate using the second detected currents that corresponds to the target current through the channel region; and apply a third pulse of programming voltages to the source region, the select gate, the erase gate and the control gate, wherein the third pulse of programming voltages includes a third voltage applied to the control gate that is determined from the second voltage plus the nominal voltage minus the second target voltage.

5. The memory device of claim 4, wherein the control circuitry is further configured to, for the one memory cell, perform an erase operation, after the second read operation and before the applying of the third pulse of programming voltages, that includes applying a positive voltage to the erase gate.

6. The memory device of claim 1, wherein the control circuitry is further configured to:

simultaneously apply the first pulse of programming voltages to a first plurality of the memory cells, wherein the first plurality of the memory cells includes memory cells located in two or more of the rows of the memory cells and in two or more of the columns of the memory cells; and simultaneously apply the second pulse of programming voltages to a second plurality of the memory cells, wherein the second plurality of the memory cells includes memory cells located in two or more of the rows of the memory cells and in only one of the columns of the memory cells.

7. A memory device, comprising:

memory cells arranged in rows and columns, wherein each of the memory cells includes:

a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate; and control circuitry configured to, for one of the memory cells:

apply a first pulse of programming voltages to the source region, the select gate, the erase gate and the control gate, wherein the first pulse of programming voltages includes a first voltage applied to the erase gate, perform a read operation, after the applying of the first pulse of programming voltages, that includes detecting currents through the channel region for different voltages applied to the erase gate, and determining a target voltage for the erase gate using the detected currents that corresponds to a target current through the channel region, apply a second pulse of programming voltages to the source region, the select gate, the erase gate and the control gate, wherein the second pulse of programming voltages includes a second voltage applied to the erase gate that is determined from the first voltage, a nominal voltage and the target voltage, and determine, after the applying of the first and second pulses of programming voltages, a program state of the one memory cell by applying respective read voltages to the drain region, the select gate, the erase gate and the control gate, while detecting any current in the channel region, wherein the read voltages include the nominal voltage applied to the erase gate.

8. The memory device of claim 7, wherein, for the one memory cell, the second voltage applied to the erase gate is determined from the first voltage plus the nominal voltage minus the target voltage.

9. The memory device of claim 7, wherein the control circuitry is further configured to, for the one memory cell, perform an erase operation, after the read operation and before the applying of the second pulse of programming voltages, that includes applying a positive voltage to the erase gate.

10. The memory device of claim 7, wherein the control circuitry is further configured to, for the one memory cell:

perform a second read operation, after the applying of the first and second pulses of programming voltages, that includes detecting second currents through the channel region for different voltages applied to the erase gate, and determining a second target voltage for the erase gate using the second detected currents that corresponds to the target current through the channel region; and apply a third pulse of programming voltages to the source region, the select gate, the erase gate and the control gate, wherein the third pulse of programming voltages includes a third voltage applied to the erase gate that is determined from the second voltage plus the nominal voltage minus the second target voltage.

11. The memory device of claim 10, wherein the control circuitry is further configured to, for the one memory cell, perform an erase operation, after the second read operation and before the applying of the third pulse of programming voltages, that includes applying a positive voltage to the erase gate.

12. The memory device of claim 7, wherein the control circuitry is further configured to:
simultaneously apply the first pulse of programming voltages to a first plurality of the memory cells, wherein the first plurality of the memory cells includes memory cells located in two or more of the rows of the memory cells and in two or more of the columns of the memory cells; and
simultaneously apply the second pulse of programming voltages to a second plurality of the memory cells, wherein the second plurality of the memory cells includes memory cells located in two or more of the rows of the memory cells and in only one of the columns of the memory cells.

13. A memory device, comprising:
memory cells arranged in rows and columns, wherein each of the memory cells includes:
a source region and a drain region formed in a semiconductor substrate, with a channel region of the substrate extending between the source and drain regions,
a floating gate disposed over and insulated from a first portion of the channel region, for controlling a conductivity of the first portion of the channel region,
a select gate disposed over and insulated from a second portion of the channel region, for controlling a conductivity of a second portion of the channel region,
a control gate disposed over and insulated from the floating gate, and
an erase gate disposed over and insulated from the source region, and disposed adjacent to and insulated from the floating gate; and
control circuitry configured to, for one of the memory cells:
apply a first pulse of programming voltages to the source region, the select gate, the erase gate and the control gate, wherein the first pulse of programming voltages includes a first voltage applied to the control gate and a second voltage applied to the erase gate,
perform a read operation, after the applying of the first pulse of programming voltages, that includes detecting currents through the channel region for different voltages applied to the control gate and the erase gate, and determining a first target voltage for the control gate and a second target voltage for the erase gate using the detected currents that correspond to a target current through the channel region,
apply a second pulse of programming voltages to the source region, the select gate, the erase gate and the control gate, wherein the second pulse of programming voltages includes:
a third voltage applied to the control gate that is determined from the first voltage, a first nominal voltage and the first target voltage, and
a fourth voltage applied to the erase gate that is determined from the second voltage, a second nominal voltage and the second target voltage, and
determine, after the applying of the first and second pulses of programming voltages, a program state of the one memory cell by applying respective read voltages to the drain region, the select gate, the erase gate and the control gate, while detecting any current in the channel region, wherein the read voltages include the first nominal voltage applied to the control gate and the second nominal voltage applied to the erase gate.

14. The memory device of claim 13, wherein, for the one memory cell:
the third voltage applied to the control gate is determined from the first voltage plus the first nominal voltage minus the first target voltage; and
the fourth voltage applied to the erase gate is determined from the second voltage plus the second nominal voltage minus the second target voltage.

15. The memory device of claim 13, wherein the control circuitry is further configured to, for the one memory cell, perform an erase operation, after the read operation and before the applying of the second pulse of programming voltages, that includes applying a positive voltage to the erase gate.

16. The memory device of claim 13, wherein the control circuitry is further configured to:
simultaneously apply the first pulse of programming voltages to a first plurality of the memory cells, wherein the first plurality of the memory cells includes memory cells located in two or more of the rows of the memory cells and in two or more of the columns of the memory cells; and
simultaneously apply the second pulse of programming voltages to a second plurality of the memory cells, wherein the second plurality of the memory cells includes memory cells located in two or more of the rows of the memory cells and in only one of the columns of the memory cells.

17. A method of operating a memory device that includes memory cells arranged in rows and columns, wherein each of the memory cells includes:
a source region and a drain region formed in a semiconductor substrate, with a channel region of the substrate extending between the source and drain regions,
a floating gate disposed over and insulated from a first portion of the channel region, for controlling a conductivity of the first portion of the channel region,
a select gate disposed over and insulated from a second portion of the channel region, for controlling a conductivity of a second portion of the channel region,
a control gate disposed over and insulated from the floating gate, and
an erase gate disposed over and insulated from the source region, and disposed adjacent to and insulated from the floating gate;
the method comprising, for one of the memory cells:
applying a first pulse of programming voltages to the source region, the select gate, the erase gate and the control gate, wherein the first pulse of programming voltages includes a first voltage applied to the control gate,
performing a read operation, after the applying of the first pulse of programming voltages, that includes detecting currents through the channel region for different voltages applied to the control gate, and determining a target voltage for the control gate using the detected currents that corresponds to a target current through the channel region, applying a second pulse of programming voltages to the source region, the select gate, the erase gate and the control gate, wherein the second pulse of programming voltages includes a second voltage applied to the control gate that is determined from the first voltage, a nominal voltage and the target voltage, and determining, after the applying of the first and second pulses of programming voltages, a program state of the one memory cell by applying respective read voltages to the drain region, the select gate and the control gate, while detecting any current in the channel region, wherein the read voltages include the nominal voltage applied to the control gate.

18. The method of claim 17, wherein, for the one memory cell, the second voltage applied to the control gate is determined from the first voltage plus the nominal voltage minus the target voltage.

19. The method of claim 17, further comprising, for the one memory cell:
performing an erase operation, after the read operation and before the applying of the second pulse of programming voltages, that includes applying a positive voltage to the erase gate.

20. The method of claim 17, further comprising, for the one memory cell:
performing a second read operation, after the applying of the first and second pulses of programming voltages, that includes detecting second currents through the channel region for different voltages applied to the control gate, and determining a second target voltage for the control gate using the second detected currents that corresponds to the target current through the channel region; and
applying a third pulse of programming voltages to the source region, the select gate, the erase gate and the control gate, wherein the third pulse of programming voltages includes a third voltage applied to the control gate that is determined from the second voltage plus the nominal voltage minus the second target voltage.

21. The method of claim 20, further comprising, for the one memory cell:
performing an erase operation, after the second read operation and before the applying of the third pulse of programming voltages, that includes applying a positive voltage to the erase gate.

22. The method of claim 17, further comprising:
simultaneously applying the first pulse of programming voltages to a first plurality of the memory cells, wherein the first plurality of the memory cells includes memory cells located in two or more of the rows of the memory cells and in two or more of the columns of the memory cells; and
simultaneously applying the second pulse of programming voltages to a second plurality of the memory cells, wherein the second plurality of the memory cells includes memory cells located in two or more of the rows of the memory cells and in only one of the columns of the memory cells.

23. A method of operating a memory device that includes memory cells arranged in rows and columns, wherein each of the memory cells includes:

a source region and a drain region formed in a semiconductor substrate, with a channel region of the substrate extending between the source and drain regions, a floating gate disposed over and insulated from a first portion of the channel region, for controlling a conductivity of the first portion of the channel region, a select gate disposed over and insulated from a second portion of the channel region, for controlling a conductivity of a second portion of the channel region, a control gate disposed over and insulated from the floating gate, and an erase gate disposed over and insulated from the source region, and disposed adjacent to and insulated from the floating gate;

the method comprising, for one of the memory cells:
applying a first pulse of programming voltages to the source region, the select gate, the erase gate and the control gate, wherein the first pulse of programming voltages includes a first voltage applied to the erase gate, performing a read operation, after the applying of the first pulse of programming voltages, that includes detecting currents through the channel region for different voltages applied to the erase gate, and determining a target voltage for the erase gate using the detected currents that corresponds to a target current through the channel region, applying a second pulse of programming voltages to the source region, the select gate, the erase gate and the control gate, wherein the second pulse of programming voltages includes a second voltage applied to the erase gate that is determined from the first voltage, a nominal voltage and the target voltage, and determining, after the applying of the first and second pulses of programming voltages, a program state of the one memory cell by applying respective read voltages to the drain region, the select gate, the erase gate and the control gate, while detecting any current in the channel region, wherein the read voltages include the nominal voltage applied to the erase gate.

24. The method of claim 23, wherein, for the one memory cell, the second voltage applied to the erase gate is determined from the first voltage plus the nominal voltage minus the target voltage.

25. The method of claim 23, further comprising, for the one memory cell:
performing an erase operation, after the read operation and before the applying of the second pulse of programming voltages, that includes applying a positive voltage to the erase gate.

26. The method of claim 23, further comprising, for the one memory cell:
performing a second read operation, after the applying of the first and second pulses of programming voltages, that includes detecting second currents through the channel region for different voltages applied to the erase gate, and determining a second target voltage for the erase gate using the second detected currents that corresponds to the target current through the channel region; and
applying a third pulse of programming voltages to the source region, the select gate, the erase gate and the control gate, wherein the third pulse of programming voltages includes a third voltage applied to the erase gate that is determined from the second voltage plus the nominal voltage minus the second target voltage.

27. The method of claim 26, further comprising, for the one memory cell:
performing an erase operation, after the second read operation and before the applying of the third pulse of programming voltages, that includes applying a positive voltage to the erase gate.

28. The method of claim 23, further comprising:
simultaneously applying the first pulse of programming voltages to a first plurality of the memory cells, wherein the first plurality of the memory cells includes memory cells located in two or more of the rows of the memory cells and in two or more of the columns of the memory cells; and
simultaneously applying the second pulse of programming voltages to a second plurality of the memory cells, wherein the second plurality of the memory cells includes memory cells located in two or more of the rows of the memory cells and in only one of the columns of the memory cells.

29. A method of operating a memory device that includes memory cells arranged in rows and columns, wherein each of the memory cells includes:
a source region and a drain region formed in a semiconductor substrate, with a channel region of the substrate extending between the source and drain regions,
a floating gate disposed over and insulated from a first portion of the channel region, for controlling a conductivity of the first portion of the channel region,
a select gate disposed over and insulated from a second portion of the channel region, for controlling a conductivity of a second portion of the channel region,
a control gate disposed over and insulated from the floating gate, and
an erase gate disposed over and insulated from the source region, and disposed adjacent to and insulated from the floating gate;
the method comprising, for one of the memory cells:
applying a first pulse of programming voltages to the source region, the select gate, the erase gate and the control gate, wherein the first pulse of programming voltages includes a first voltage applied to the control gate and a second voltage applied to the erase gate,
performing a read operation, after the applying of the first pulse of programming voltages, that includes detecting currents through the channel region for different voltages applied to the control gate and the erase gate, and determining a first target voltage for the control gate and a second target voltage for the erase gate using the detected currents that correspond to a target current through the channel region,
applying a second pulse of programming voltages to the source region, the select gate, the erase gate and the control gate, wherein the second pulse of programming voltages includes:
a third voltage applied to the control gate that is determined from the first voltage, a first nominal voltage and the first target voltage, and
a fourth voltage applied to the erase gate that is determined from the second voltage, a second nominal voltage and the second target voltage, and
determining, after the applying of the first and second pulses of programming voltages, a program state of the one memory cell by applying respective read voltages to the drain region, the select gate, the erase gate and the control gate, while detecting any current in the channel region, wherein the read voltages include the first nominal voltage applied to the control gate and the second nominal voltage applied to the erase gate.

30. The method of claim 29, wherein, for the one memory cell:
the third voltage applied to the control gate is determined from the first voltage plus the first nominal voltage minus the first target voltage, and
the fourth voltage applied to the erase gate is determined from the second voltage plus the second nominal voltage minus the second target voltage.

31. The method of claim 29, further comprising, for the one memory cell:
performing an erase operation, after the read operation and before the applying of the second pulse of programming voltages, that includes applying a positive voltage to the erase gate.

32. The method of claim 29, further comprising:
simultaneously applying the first pulse of programming voltages to a first plurality of the memory cells, wherein the first plurality of the memory cells includes memory cells located in two or more of the rows of the memory cells and in two or more of the columns of the memory cells; and
simultaneously applying the second pulse of programming voltages to a second plurality of the memory cells, wherein the second plurality of the memory cells includes memory cells located in two or more of the rows of the memory cells and in only one of the columns of the memory cells.

* * * * *